US012772505B2

(12) United States Patent
Li et al.

(10) Patent No.: US 12,772,505 B2
(45) Date of Patent: Oct. 20, 2026

(54) METHOD FOR FABRICATING VERTICAL CHANNEL NANOWIRE TRANSISTOR WITH ASYMMETRIC STRESS DISTRIBUTION

(71) Applicants: Peking University, Beijing (CN); Beijing Intellectual Property Operation Management Co., LTD, Beijing (CN)

(72) Inventors: Ming Li, Beijing (CN); Ran Bi, Beijing (CN)

(73) Assignees: Peking University, Beijing (CN); Beijing Intellectual Property Operation Management Co., LTD, Beijing (CN)

( * ) Notice: Subject to any disclaimer, the term of this patent is extended or adjusted under 35 U.S.C. 154(b) by 489 days.

(21) Appl. No.: 18/446,435

(22) Filed: Aug. 8, 2023

(65) Prior Publication Data

US 2023/0387303 A1 Nov. 30, 2023

(30) Foreign Application Priority Data

Oct. 27, 2022 (CN) ........................ 202211323483.X

(51) Int. Cl.

| | |
|---|---|
| ***H10D 30/69*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |

(Continued)

(52) U.S. Cl.

CPC ......... *H10D 30/797* (2025.01); *H10D 30/014* (2025.01); *H10D 30/43* (2025.01); *H10D 30/6728* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/0188* (2025.01); *H10D 84/0195* (2025.01); *H10D 84/038* (2025.01); *H10D 84/85* (2025.01)

(58) Field of Classification Search

None

See application file for complete search history.

(56) References Cited

U.S. PATENT DOCUMENTS

| | | | | |
|---|---|---|---|---|
| 11,201,093 | B2 | 12/2021 | Veloso et al. | |
| 2020/0105875 | A1* | 4/2020 | Li | H10D 84/0135 |
| 2022/0190169 | A1 | 6/2022 | Zhu | |

* cited by examiner

*Primary Examiner* — Kyoung Lee

(57) ABSTRACT

A method for fabricating a vertical channel nanowire transistor with asymmetric stress distribution includes: (A) growing epitaxially a single-crystal material on a substrate; forming a laminate of a bottom source-drain material and a channel material; and generating a vertical uniaxial stress in the lightly-doped channel layer; (B) forming an inter-device isolation in an active layer; (C) forming a vertical channel by patterning; (D) depositing a dielectric layer to form a bottom gate isolation; (E) depositing a dummy gate layer followed by patterning to form a dummy gate pattern; (F) depositing a dielectric layer to form a top gate isolation; (G) patterning the top gate isolation; and forming a top source-drain by epitaxy growth; (H) removing a dummy gate; and forming a gate oxide layer and a metal gate; and (I) forming metal contact at individual ends of the device.

10 Claims, 43 Drawing Sheets

(51) Int. Cl.

| | |
|---|---|
| ***H10D 84/03*** | (2025.01) |
| ***H10D 84/85*** | (2025.01) |

METHOD FOR FABRICATING VERTICAL CHANNEL NANOWIRE TRANSISTOR WITH ASYMMETRIC STRESS DISTRIBUTION

CROSS-REFERENCE TO RELATED APPLICATIONS

This application claims the benefit of priority from Chinese Patent Application No. 202211323483.X, filed on Oct. 27, 2022. The content of the aforementioned application, including any intervening amendments thereto, is incorporated herein by reference in its entirety.

TECHNICAL FIELD

This application relates to fabrication of very large-scale integration circuits (VLSIs), and more particularly to a method for fabricating a vertical channel nanowire/nanosheet transistor with asymmetric stress distribution.

BACKGROUND

After semiconductor devices reach the 5-nm technology node, lateral channel transistors, represented by fin-shaped field-effect transistor (FinFET), are faced with a challenge that size and density of the transistors reach the lithographic limit in the scaling-down process. By comparison, the physical gate length and contact hole spacing of vertical channel nanowire/nanosheet transistors can be scaled down independently of the channel projection area to improve the integration density, and thus the vertical channel nanowire/nanosheet transistors have attracted considerable attention.

In complementary metal-oxide semiconductor (CMOS) circuits, the on currents of the N-type device and the P-type device are required to match each other to achieve complementarity between the N-type and P-type devices. In silicon materials, holes are much lower than electrons in mobility but are more sensitive to strain changes. Thus, stress engineering techniques (e.g., strained silicon technology and source/drain stress engineering) are often applied in the integration process of lateral CMOS devices to enhance the drive current of P-type devices.

At present, the reported integration schemes of vertical channel nanowire/nanosheet devices mainly adopt anisotropic etching to form vertical channels. During the etching process, the stress will undergo evolution based on the pattern size, and the magnitude and direction of the stress will be redistributed. Moreover, due to the limitation of channel orientation, stress cannot be applied to the channel in the vertical channel device through conventional stress engineering strategies.

Therefore, an integrated solution for stress application and regulation is urgently needed to fabricate vertical channel CMOS devices with complementary drive current.

SUMMARY

In view of the deficiencies in the prior art, this application provides a method for fabricating a vertical channel nanowire transistor with asymmetric stress distribution, which is conducive to realizing the complementarity between on currents of N-type devices and P-type devices.

Technical solutions of this application are described as follows.

This application provides a method for fabricating a vertical channel nanowire transistor with asymmetric stress distribution, including:

(A) growing epitaxially a single crystal material layer on a substrate, wherein for a N-type metal oxide semiconductor (NMOS) device, a lattice constant of a heavily-doped active region material is greater than that of a lightly-doped channel layer; and for a P-type metal oxide semiconductor (PMOS) device, a lattice constant of a heavily-doped active region material is less than that of a lightly-doped channel layer; forming a laminate consisting of a bottom source-drain material and a channel material; and generating a vertical uniaxial stress in the lightly-doped channel layer through lattice mismatch;

(B) forming an inter-device isolation in an active layer;

(C) forming a vertical channel by patterning;

(D) depositing a layer of a first dielectric material to form a bottom gate isolation;

(E) depositing a layer of a dummy gate material followed by patterning to form a dummy gate pattern;

(F) depositing a layer of a second dielectric material to form a top gate isolation;

(G) patterning the top gate isolation, and forming a top source-drain by epitaxy growth, wherein for the NMOS device, a lattice constant of a material of the top source-drain is greater than that of a lightly-doped channel layer; for the PMOS device, the lattice constant of the material of the top source-drain is less than that of a lightly-doped channel layer; and the lattice constant of the material of the top source-drain is different from a lattice constant of the bottom source-drain material to realize asymmetric stress distribution in the vertical channel and regulation of channel stress, so as to ensure that the vertical uniaxial stress is generated on the lightly-doped channel layer through lattice mismatch;

(H) removing a dummy gate; and forming a gate oxide layer and a metal gate;

(I) forming a source metal contact, a drain-metal contact, and a gate metal contact; and (J) performing a back-end-of-line (BEOL) process to complete integration of the vertical channel nanowire transistor.

In an embodiment, the step (A) includes:

(A1) covering a PMOS region with a first hard mask material, and selectively growing epitaxially a layer of a first semiconductor material on the substrate to form a N-type heavily-doped active region, wherein the N-type heavily-doped active region is a lower source or drain end of a vertical transistor;

(A2) growing epitaxially a layer of a second semiconductor material to form a P-type lightly-doped region, wherein a thickness of the P-type lightly-doped region defines a channel length of a N-type device;

(A3) removing the first hard mask material from the PMOS region; and covering a NMOS region with a second hard mask material;

(A4) selectively growing epitaxially a layer of a third semiconductor material to form a P-type heavily-doped active region, wherein the P-type heavily-doped active region is the lower source or drain end of the vertical transistor; and (A5) growing epitaxially a layer of a fourth semiconductor material to form a N-type lightly-doped region, wherein a thickness of the N-type lightly-doped region defines a channel length of a P-type device;

wherein each of the first semiconductor material, the second semiconductor material, the third semiconductor material, and the fourth semiconductor material has a single crystal structure.

In an embodiment, the step (C) includes:

(C1) depositing a layer of a third dielectric material as a hard mask material to protect a channel pattern from being etched;

(C2) defining the vertical channel by photolithography, wherein a size and shape of the vertical channel determine a channel section of the vertical channel nanowire transistor;

(C3) forming a hard mask pattern by anisotropic etching, wherein a lightly-doped layer is exposed in an area unprotected by a photoresist; and (C4) forming the vertical channel by anisotropic etching, wherein a bottom heavily-doped active region is exposed in the area unprotected by the photoresist, and an etching depth is larger than a thickness of an entire lightly-doped area.

In an embodiment, the step (D) includes:

(D1) depositing the layer of the first dielectric material;

(D2) planarizing a surface of the layer of the first dielectric material through chemical mechanical polishing (CMP); and (D3) etching back the layer of the first dielectric material to a position below the channel layer by anisotropic etching, wherein a size of the layer of the first dielectric material below a lower surface of the channel layer is a size of a gate-to-source/drain overlap area.

In an embodiment, the step (E) includes:

(E1) depositing the layer of the dummy gate material;

(E2) planarizing a surface of the layer of the dummy gate material through CMP;

(E3) etching back the layer of the dummy gate material to a position below a surface of a hard mask by anisotropic etching and above a surface of a lightly-doped channel layer, wherein a remaining thickness of the layer of the dummy gate material defines a gate length;

(E4) removing the hard mask;

(E5) forming the dummy gate pattern by photolithography, wherein the dummy gate pattern determines a gate layout of the vertical channel nanowire transistor; and (E6) removing the dummy gate material that is not protected by photoresist by anisotropic etching to expose the bottom gate isolation.

In an embodiment, the step (F) includes:

(F1) depositing the layer of the second dielectric material, wherein the second dielectric material is the same as the first dielectric material; and a thickness of the layer of the second dielectric material is greater than a height of the dummy gate pattern;

(F2) planarizing a surface of the layer of the second dielectric material through CMP; and (F3) thinning the layer of the second dielectric material by anisotropic etching such that a thickness of the layer of the second dielectric material meets requirements of an isolation gate and source-drain.

In an embodiment, the step (G) includes:

(G1) defining an epitaxial window of the top source-drain by photolithography, wherein a photolithographic pattern is aligned with a lower channel pattern;

(G2) forming the epitaxial window of the top source-drain by anisotropic etching to expose the lightly-doped channel layer; and (G3) forming a top heavily-doped source-drain by selective epitaxial growth, wherein the top source-drain material has a single crystal structure; and the lattice constant of the top source-drain material is greater or less than that of the lightly-doped channel layer.

In an embodiment, the step (H) includes:

(H1) depositing a layer of a third dielectric material, wherein a thickness of the layer of the third dielectric material is greater than an epitaxy height of the top source-drain;

(H2) defining a window by photolithography and anisotropic etching to expose the layer of the dummy gate;

(H3) removing the dummy gate through isotropic etching;

(H4) filling a cavity formed after removing the dummy gate with a gate oxide layer material and a metal gate material in turn through isotropic shape retention; and (H5) removing a top of the layer of the third dielectric material by anisotropic etching.

In an embodiment, the step (I) includes:

(I1) depositing a layer of a third dielectric material as an interlayer isolation, and planarizing the layer of the third dielectric material by CMP;

(I2) forming a source contact hole, a drain contact hole, and a gate contact hole by photolithography and anisotropic etching;

(I3) filling the source contact hole, the drain contact hole, and the gate contact hole with metal 0; and (I4) performing CMP on the metal 0 to separate conductive layers of devices, so as to realize device isolation.

In an embodiment, the substrate is a bulk silicon substrate, a silicon-on-insulator (SOI) substrate, a bulk germanium substrate, or a germanium-on-insulator (GOI) substrate.

This application has the following beneficial effects.

(1) Compared with the existing methods of forming vertical nanowire channels by etching, the design of source-drain material and channel material provided herein can effectively apply uniaxial stress in the channels. By adjusting the stress magnitude and distribution, the drive currents of N/P-type devices can be complementary to each other.

(2) The present application can flexibly realize the hybrid integration of channels or source/drains of multiple materials, and can realize the asymmetric distribution of stress in the device channel. Moreover, the intensity and distribution of stress in the channels can also be adjusted by adjusting the material parameters, and the on current and subthreshold characteristics of the device can be optimized at the same time.

BRIEF DESCRIPTION OF THE DRAWINGS

FIGS. 1-21 schematically show key steps for fabricating a vertical channel CMOS device according to one embodiment of the present disclosure.

DETAILED DESCRIPTION OF EMBODIMENTS

The disclosure will be further described in detail in conjunction with the accompanying drawings and embodiments.

As used herein, heavy doping indicates a doping concentration greater than 1E20 cm-3; and light doping indicates a doping concentration lower than 1E18 cm-3.

In an embodiment, for a N-type metal oxide semiconductor (NMOS) device, the material of the bottom source-drain is SiGe, and the channel material is Si. For a P-type metal oxide semiconductor (PMOS) device, the material of the bottom source-drain material is Si, and the channel material is SiGe. In the Si/SiGe superlattice structure, SiGe biaxial direction is compressive stress, and SiGe uniaxial direction is tensile stress. Si biaxial direction is tensile stress, and Si uniaxial direction is compressive stress. After dry etching, the graph edge stress is released, the uniaxial tensile stress in SiGe will evolve into the uniaxial compressive stress, and the uniaxial compressive stress of Si will evolve into the uniaxial tensile stress. Therefore, the NMOS device adopts a SiGe source-drain/Si channel structure, and the Si channel is subjected to uniaxial tensile stress after etching. The PMOS device adopts a Si source-drain/SiGe channel structure, and the SiGe channel is subjected to uniaxial compressive stress after etching. Since the hole mobility in SiGe is much higher than that in Si, the hole mobility is increased by the SiGe material, which is conducive to increasing the carrier stress while realizing the complementarity of NMOS and PMOS driving current.

According to the following steps, the complementary metal-oxide semiconductor (CMOS) integration of bulk silicon vertical nanowire devices with the diameter of 6 nm can be achieved. The structural parameters were set according to the "11/10 nm" technology generation of high-performance devices in international technology roadmap for semiconductors (ITRS)-2013.

Figure 1A:
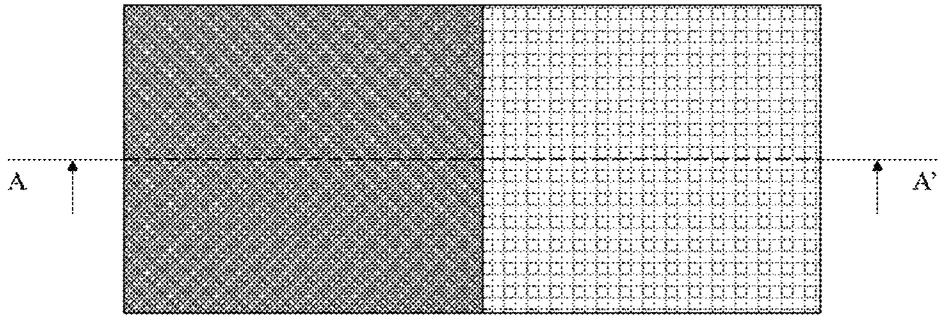
FIGS. 1*a* and 1*b* schematically show formation of a heavily-doped active region and a lightly-doped channel layer of a bottom source-drain of a N-type device by in-situ doping and epitaxy growth on a substrate according to one embodiment of the present disclosure, where (1*a*): a top view; and (1*b*): a sectional view along A-A' in (1*a*)
Figure 1B:
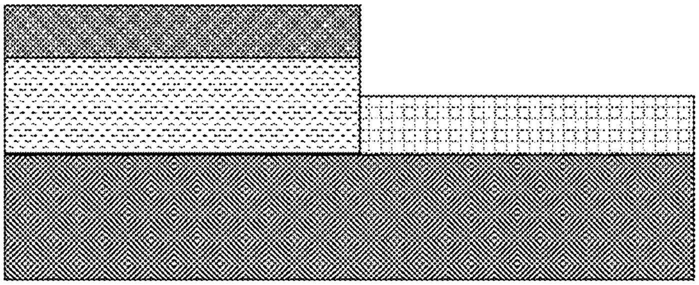

1) The hard mask material was deposited on the bulk silicon substrate, and the NMOS region was exposed by photolithography. By the in-situ doping and epitaxy technique in the NMOS region, the 100 nm N+$Si_{1-x}Ge_x$ heavily-doped active region (as the source/drain end of NMOS) was formed, and the 20 nm P Si lightly-doped layer (as the channel for NMOS) was formed on the N+ heavily-doped active region, as shown in FIGS. 1*a* and 1*b*.

Figure 2A:
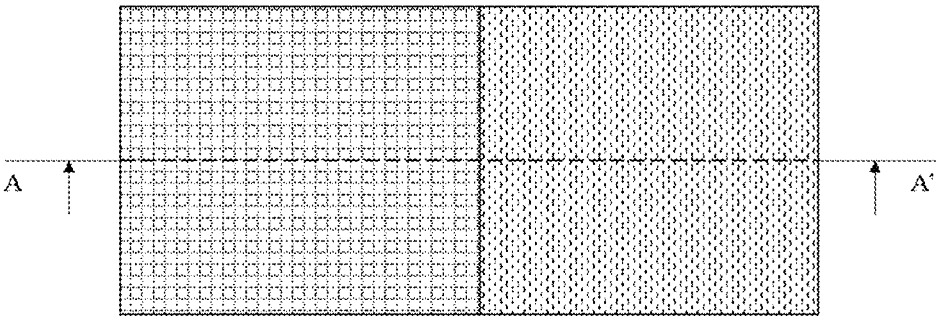
FIGS. 2*a* and 2*b* schematically show formation of a heavily-doped active region and a lightly-doped channel layer of a bottom source-drain of a P-type device by in-situ doping and epitaxy growth on a substrate according to one embodiment of the present disclosure, where (2*a*): a top view; and (2*b*): a sectional view along A-A' in (2*a*)
Figure 2B:
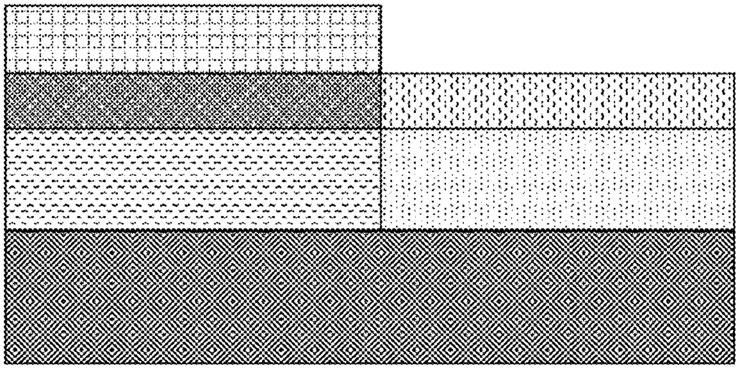

2) The residual hard mask was removed, and the new hard mask material was re-deposited. The PMOS region and the 100 nm P+Si heavily-doped active region (as the source/drain end of PMOS) were exposed by photolithography. The 20 nm N $Si_{1-x}Ge_x$ lightly-doped layer (as the channel for PMOS) was formed on the P+ heavily-doped active region, as shown in FIGS. 2a and 2b.

Figure 3A:
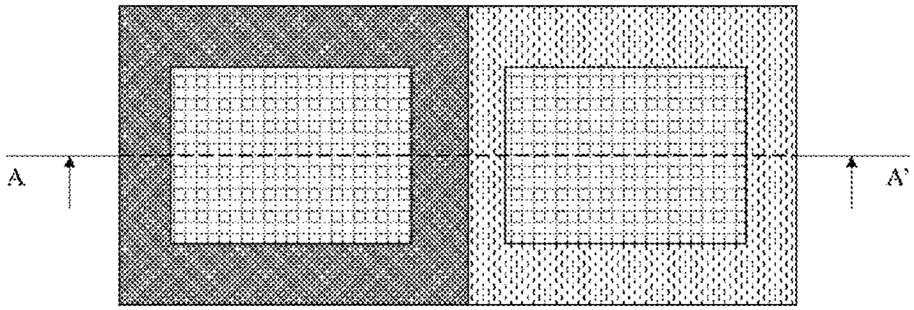
FIGS. 3*a* and 3*b* schematically show formation of a hard mask and an active region by photolithography according to one embodiment of the present disclosure, where (3*a*): a top view; and (3*b*): a sectional view along A-A' in (3*a*)
Figure 3B:
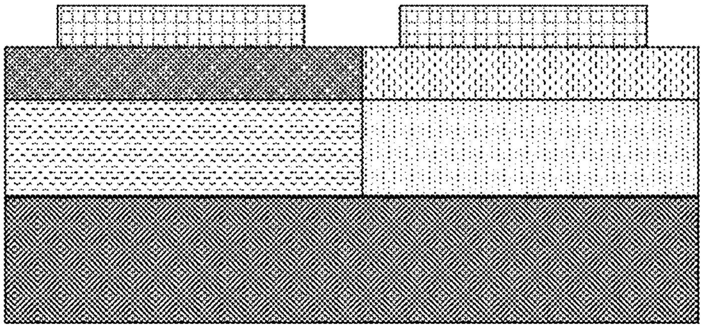

3) 20 nm $Si_3N_4$ was deposited by the low-pressure chemical vapor deposition (LPCVD) as the hard mask material for etching. The shape and size of the active region were defined by photolithography and anisotropic etching, as shown in FIGS. 3a and 3b.

Figure 4A:
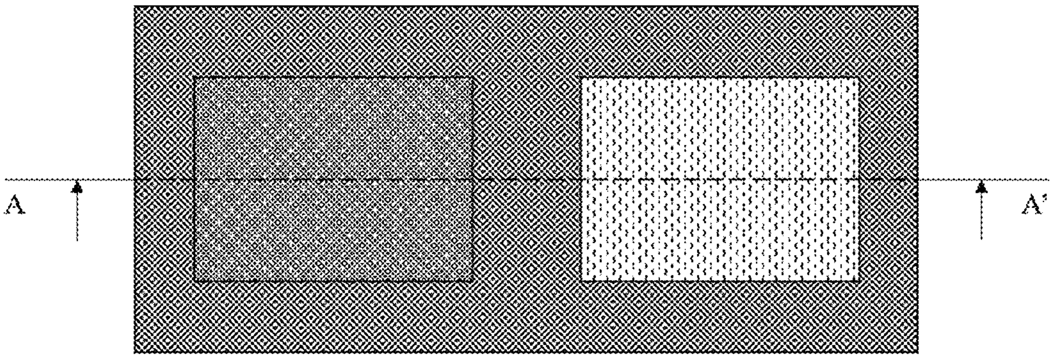
FIGS. 4*a* and 4*b* schematically show formation of an active region by etching according to one embodiment of the present disclosure, where (4*a*): a top view; and (4*b*): a sectional view along A-A' in (4*a*)
Figure 4B:
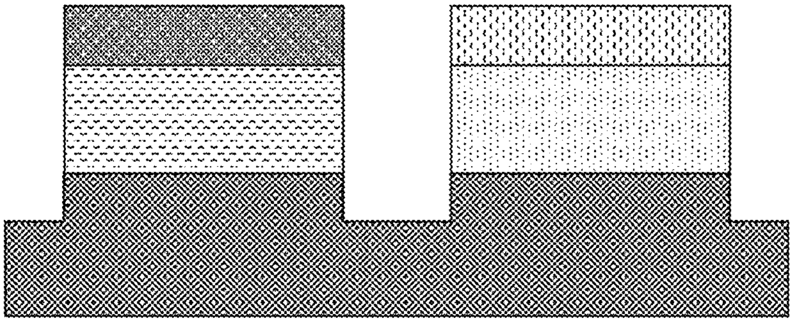

4) The active region was formed by the anisotropic etching, as shown in FIGS. 4a and 4b.

Figure 5A:
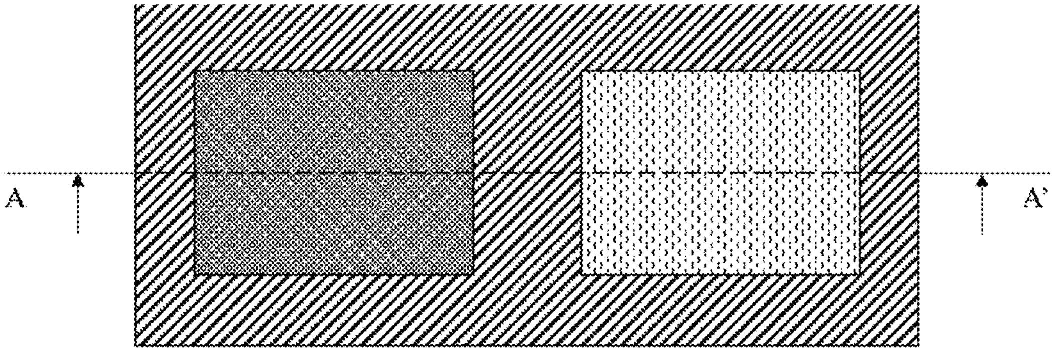
FIGS. 5*a* and 5*b* schematically show formation of a STI isolation between active regions according to one embodiment of the present disclosure, where (5*a*): a top view; and (5*b*): a sectional view along A-A' in (5*a*)
Figure 5B:
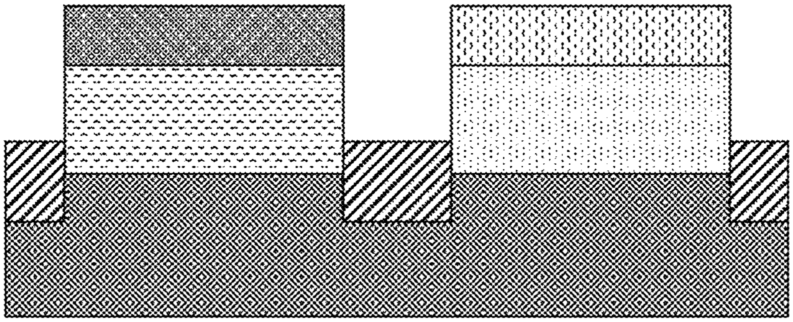

5) Shallow Trench Isolation (STI) of $SiO_2$ was formed by the conventional STI process, as shown in FIGS. 5a and 5b.

Figure 6A:
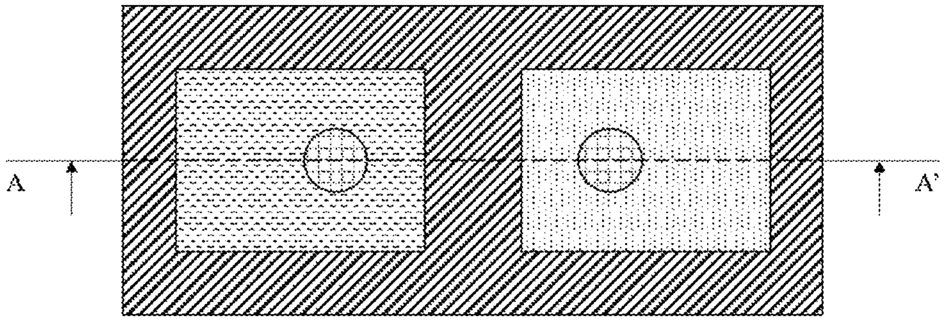
FIGS. 6*a* and 6*b* schematically show formation of a hard mask and a vertical channel by photolithography and anisotropic etching according to one embodiment of the present disclosure, where (6*a*): a top view; and (6*b*): a sectional view along A-A' in (6*a*)
Figure 6B:
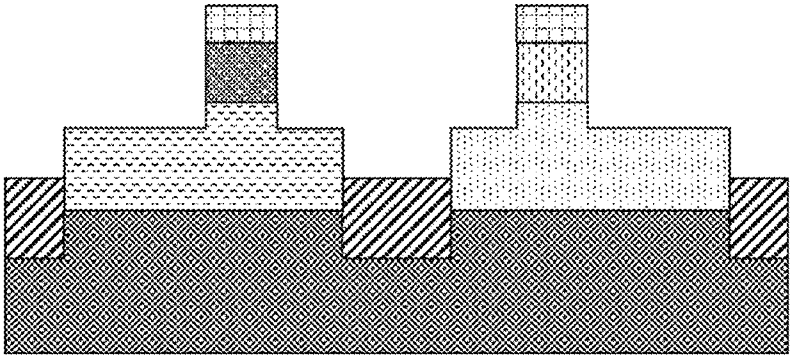

6) 20 nm $Si_3N_4$ was deposited by the LPCVD as the hard mask material. The vertical channel of the device was formed by the photolithography and anisotropic etching. In this embodiment, the vertical channel was a cylinder with the diameter of 6 nm, and the lower heavily-doped active region of N/PMOS was exposed in the area unprotected by the photoresist, as shown in FIGS. 6a and 6b.

Figure 7A:
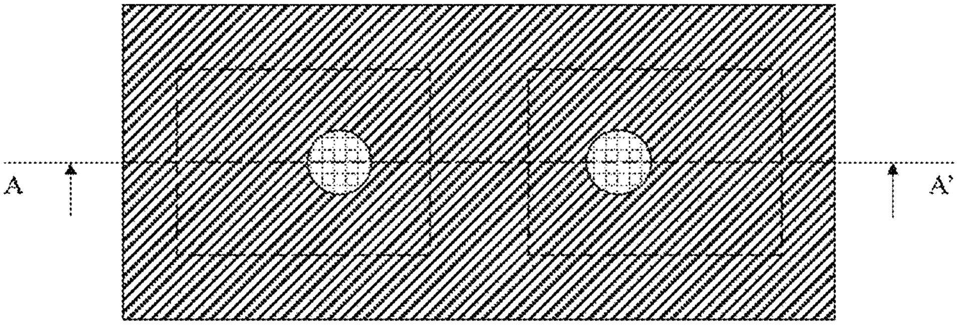
FIGS. 7*a* and 7*b* schematically show formation of a bottom gate isolation according to one embodiment of the present disclosure, where (7*a*): a top view; and (7*b*): a sectional view along A-A' in (7*a*)
Figure 7B:
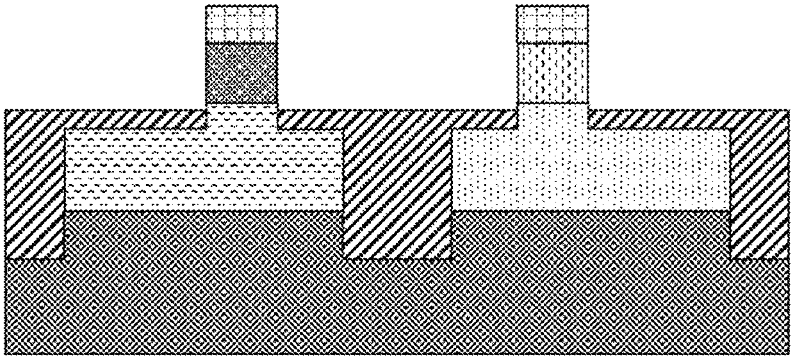

7) 300-nm $SiO_2$ was deposited by the Plasma Enhanced Chemical Vapor Deposition (PECVD), planarized by the chemical mechanical polishing (CMP), and etched back to form the bottom gate isolation with the thickness of 20 nm, as shown in FIGS. 7a and 7b.

Figure 8A:
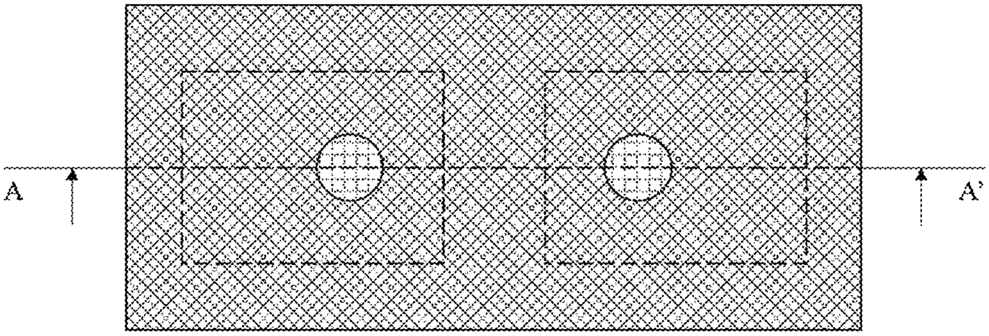
FIGS. 8*a* and 8*b* schematically show formation of a dummy gate material layer according to one embodiment of the present disclosure, where (8*a*): a top view; and (8*b*): a sectional view along A-A' in (8*a*)
Figure 8B:
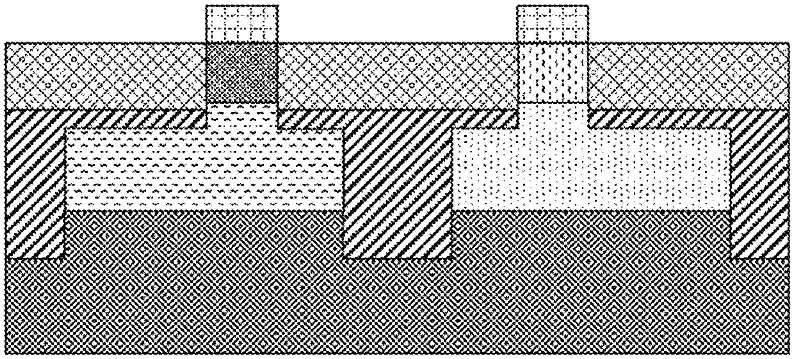

8) Amorphous Si was deposited by the PECVD, planarized by the CMP, and etched back to form the 25 nm dummy gate layer, as shown in FIGS. 8a and 8b.

9) $Si_3N_4$ hard mask was removed by etching using concentrated phosphoric acid.

Figure 9A:
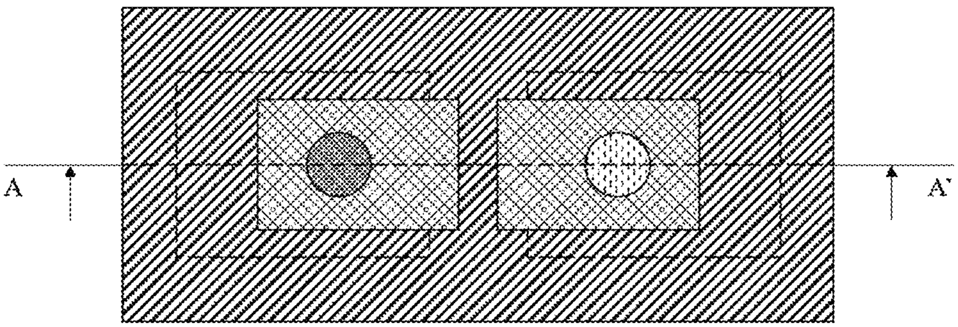
FIGS. 9*a* and 9*b* schematically show a step of removing a hard mask and patterning a dummy gate according to one embodiment of the present disclosure, where (9*a*): a top view; and (9*b*): a sectional view along A-A' in (9*a*)
Figure 9B:
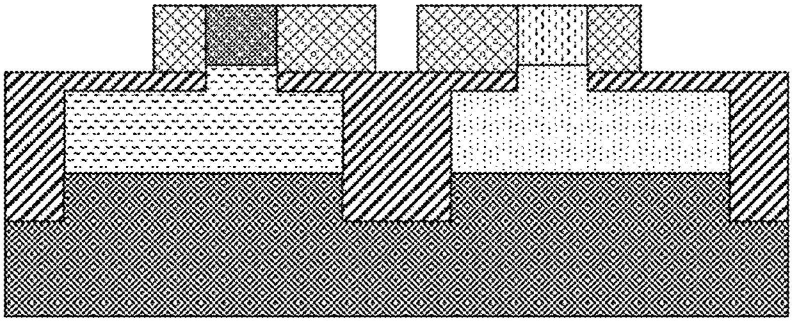

10) The dummy gate was patterned by the photolithography, and the lower bottom gate isolation was exposed in the area unprotected by the photoresist, as shown in FIGS. 9a and 9b.

Figure 10A:
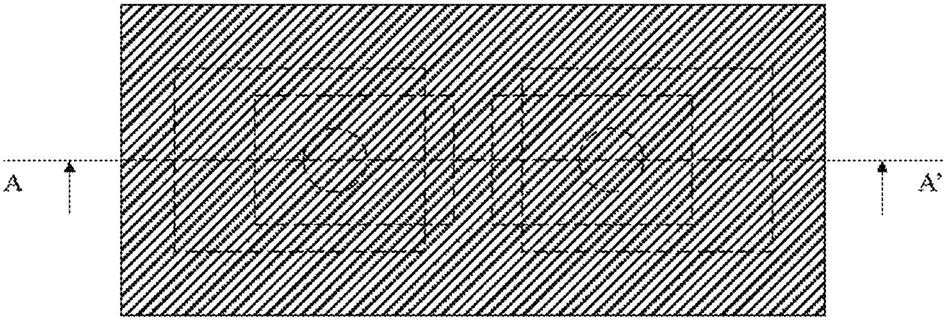
FIGS. 10*a* and 10*b* schematically show formation of a top gate isolation according to one embodiment of the present disclosure, where (10*a*): a top view; and (10*b*): a sectional view along A-A' in (10*a*)
Figure 10B:
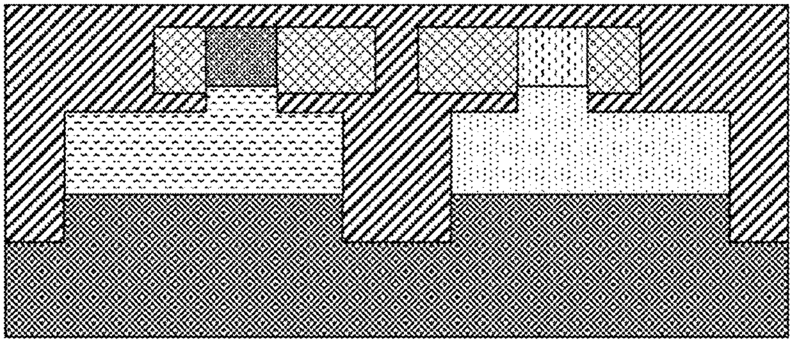

11) $SiO_2$ was deposited by the PECVD, planarized by the CMP, and etched back to form the top gate isolation, as shown in FIGS. 10a and 10b.

Figure 11A:
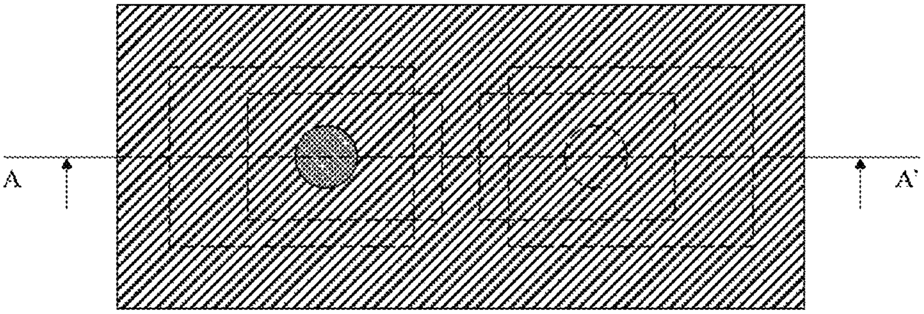
FIGS. 11*a* and 11*b* schematically show formation of an epitaxial window of a top source-drain of NMOS by photolithography according to one embodiment of the present disclosure, where (11*a*): a top view; and (11*b*): a sectional view along A-A' in (11*a*)
Figure 11B:
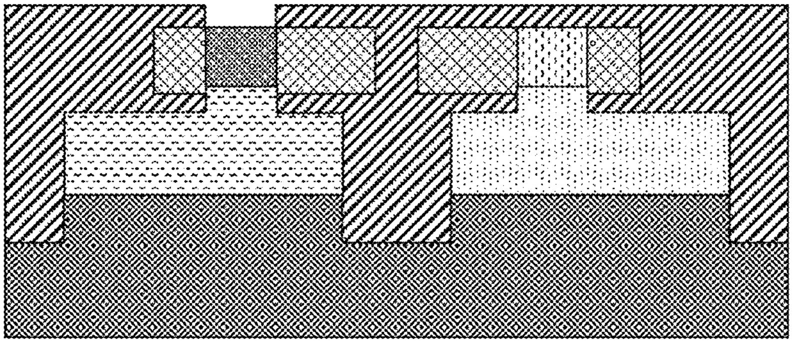

12) The epitaxy window of the top source-drain of NMOS was defined by the photolithography, as shown in FIGS. 11a and 11b.

Figure 12A:
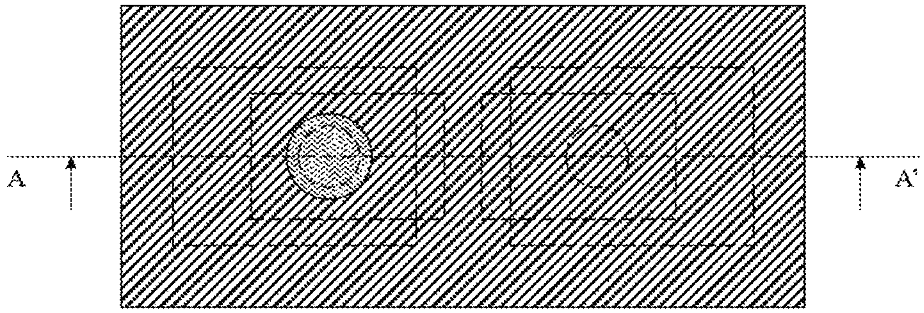
FIGS. 12*a* and 12*b* schematically show formation of a top source-drain of NMOS by in-situ doping and epitaxy growth according to one embodiment of the present disclosure, where (12*a*): a top view; and (12*b*): a sectional view along A-A' in (12*a*)
Figure 12B:
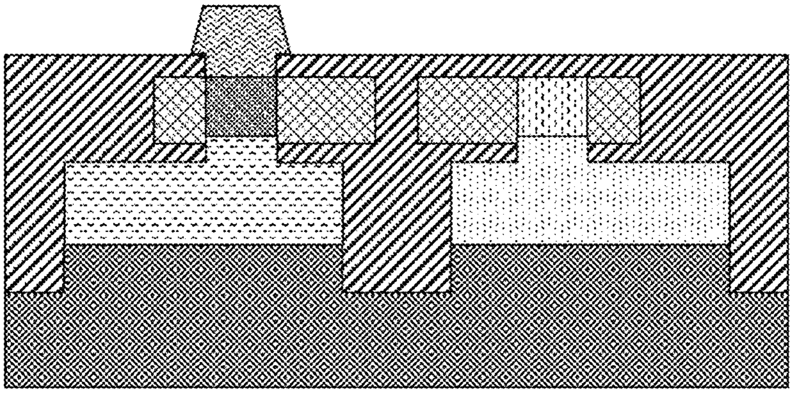

13) The heavily-doped top source-drain of NMOS was formed by the in-situ doping and epitaxy growth of $Si_{1-x}Ge_x$. In this embodiment, the Ge content of the top source-drain is different from that of the bottom source-drain, thereby realizing the stress asymmetric distribution of the device, as shown in FIGS. 12a and 12b.

14) $Si_3N_4$ was deposited and patterned to form the mask for protecting the top source-drain of the NMOS.

Figure 13A:
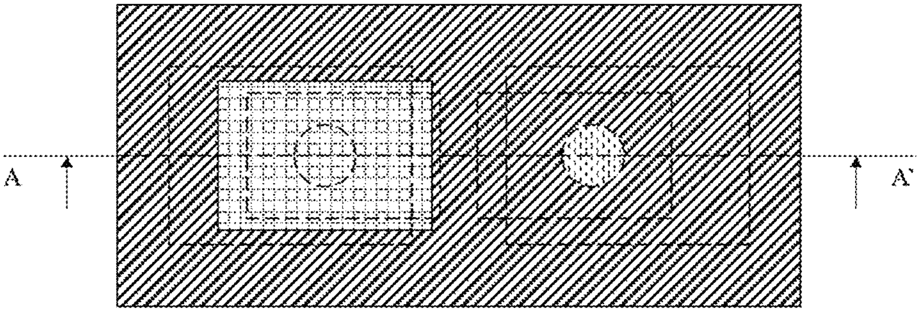
FIGS. 13*a* and 13*b* schematically show formation of an epitaxial window of a top source-drain of PMOS by photolithography according to one embodiment of the present disclosure, where (13*a*): a top view; and (13*b*): a sectional view along A-A' in (13*a*)
Figure 13B:
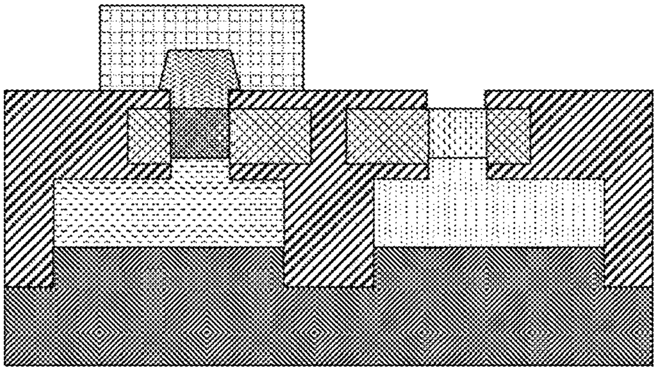

15) The epitaxy window of the top source-drain of PMOS was defined by photolithography, as shown in FIGS. 13a and 13b.

Figure 14A:
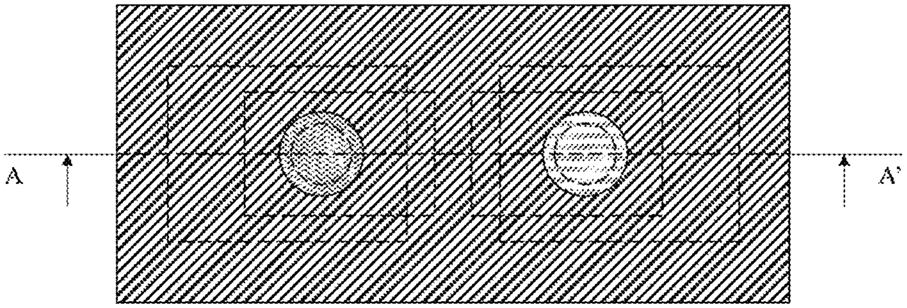
FIGS. 14*a* and 14*b* schematically show formation of a top source-drain of PMOS by in-situ doping epitaxial growth according to one embodiment of the present disclosure, where (14*a*): a top view; and (14*b*): a sectional view along A-A' in (14*a*)
Figure 14B:
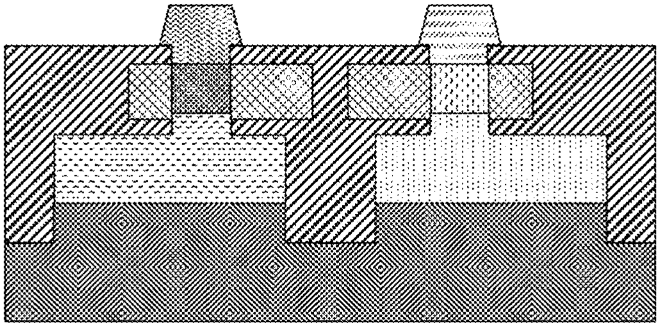

16) Atop heavily-doped source-drain of PMOS was formed by the in-situ doping and epitaxy growth of Si, as shown in FIGS. 14a and 14b.

Figure 15A:
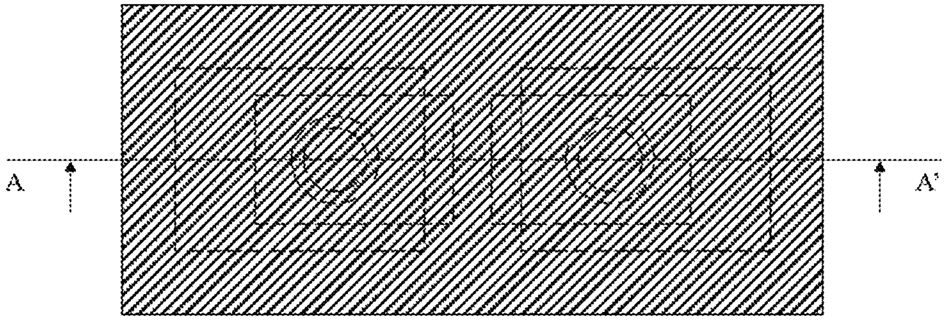
FIGS. 15*a* and 15*b* schematically show formation of an interlaminar isolation dielectric layer according to one embodiment of the present disclosure, where (15*a*): a top view; and (15*b*): a sectional view along A-A' in (15*a*)
Figure 15B:
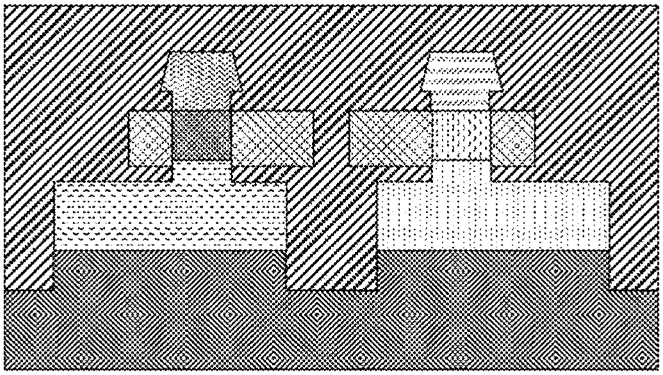

17) 100-nm $SiO_2$ was deposited by the PECVD and planarized by the CMP to form an interlaminar dielectric layer, as shown in FIGS. 15a and 15b.

Figure 16A:
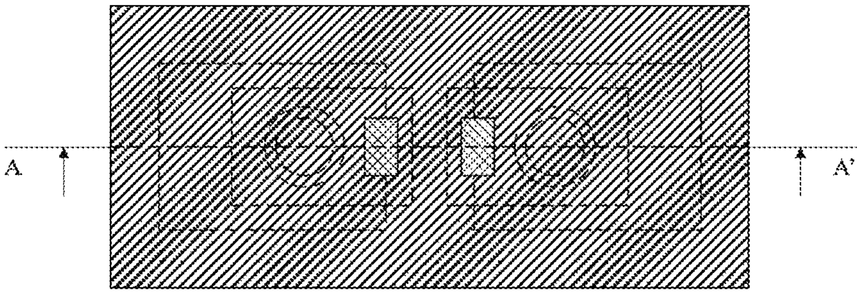
FIGS. 16*a* and 16*b* schematically show a step of exposing a window of removing a dummy gate by photolithography etching according to one embodiment of the present disclosure, where (16*a*): a top view; and (16*b*): a sectional view along A-A' in (16*a*)
Figure 16B:
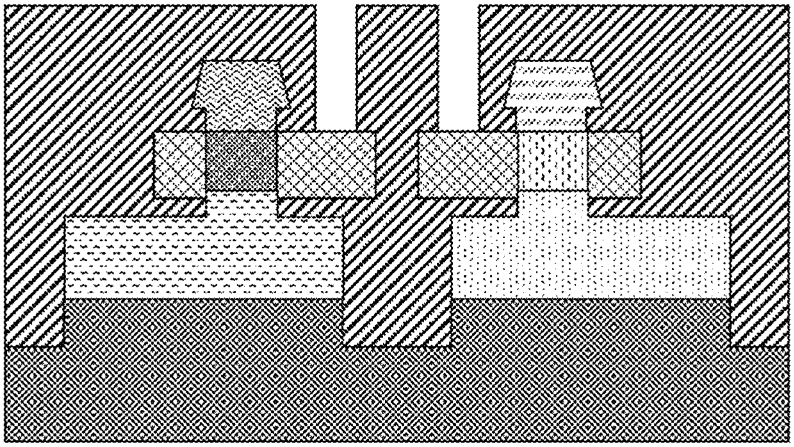

18) The window for removing dummy gate was defined by the photolithography, as shown in FIGS. 16a and 16b.

Figure 17A:
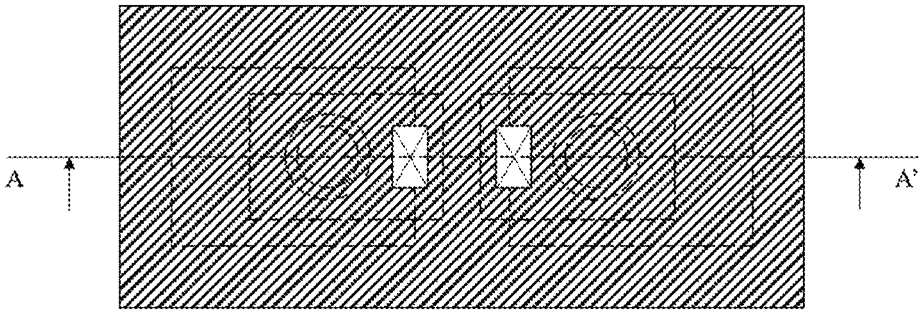
FIGS. 17*a* and 17*b* schematically show a step of removing a dummy gate material by isotropic corrosion according to one embodiment of the present disclosure, where (17*a*): a top view; and (17*b*): a sectional view along A-A' in (17*a*)
Figure 17B:
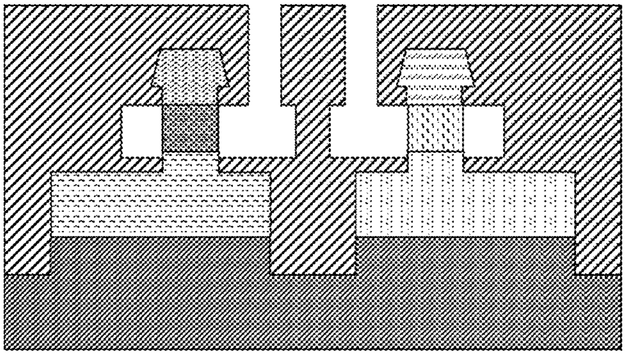

19) The non-crystalline silicon dummy gate was selectively removed by the tetramethylammonium hydroxide (TMAH), as shown in FIGS. 17a and 17b.

Figure 18A:
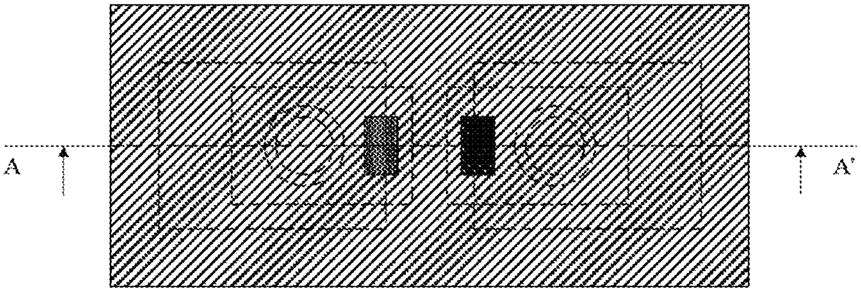
FIGS. 18*a* and 18*b* schematically show a step of filling with a High-k metal gate (HKMG) material sequentially according to one embodiment of the present disclosure, where (18*a*): a top view; and (18*b*): a sectional view along A-A' in (18*a*)
Figure 18B:
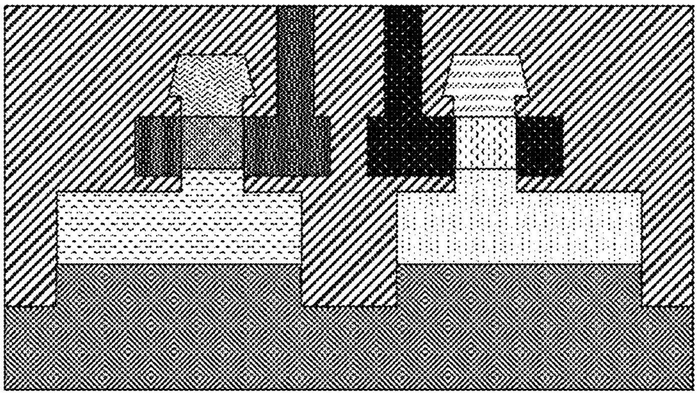

20) $HfO_2$, NMOS work function metal (WFM), and PMOS WFM were sequentially deposited by the atomic layer deposition (ALD), as shown in FIGS. 18a and 18b.

Figure 19A:
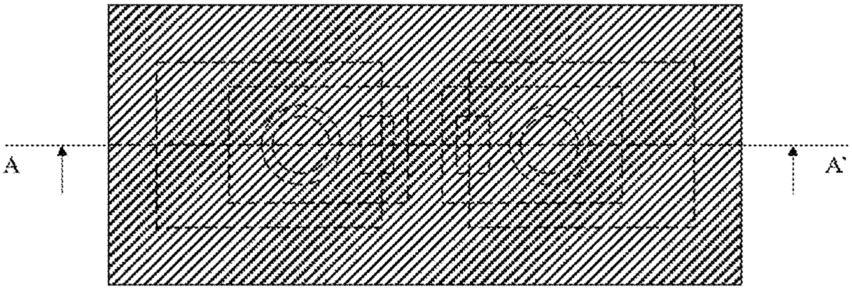
FIGS. 19*a* and 19*b* schematically show a step of depositing an interlaminar isolation dielectric layer according to one embodiment of the present disclosure, where (19*a*): a top view; and (19*b*): a sectional view along A-A' in (19*a*)
Figure 19B:
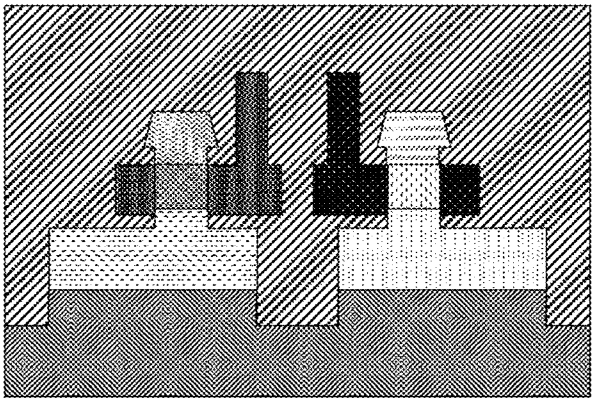

21) 200-nm $SiO_2$ was deposited by the PECVD and planarized by the CMP to form another interlaminar dielectric layer, as shown in FIGS. 19a and 19b.

Figure 20A:
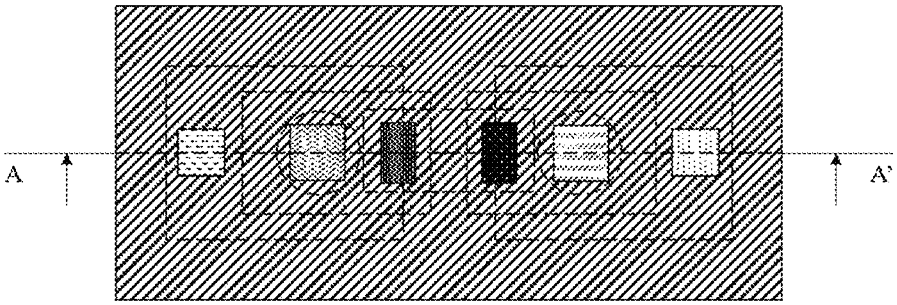
FIGS. 20*a* and 20*b* schematically show formation of a contact hole VO by photolithography according to one embodiment of the present disclosure, where (20*a*): a top view; and (20*b*): a sectional view along A-A' in (20*a*)
Figure 20B:
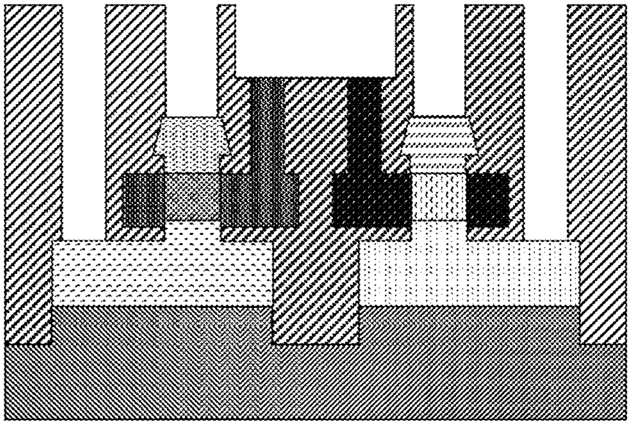

22) The source contact hole, the drain contact hole, the gate contact hole, and the body contact hole were formed by photolithography and anisotropic etching, as shown in FIGS. 20a and 20b.

23) The metal 0 was filled in each of the source contact hole, the drain contact hole, the gate contact hole, and the body contact hole by sputtering.

Figure 21A:
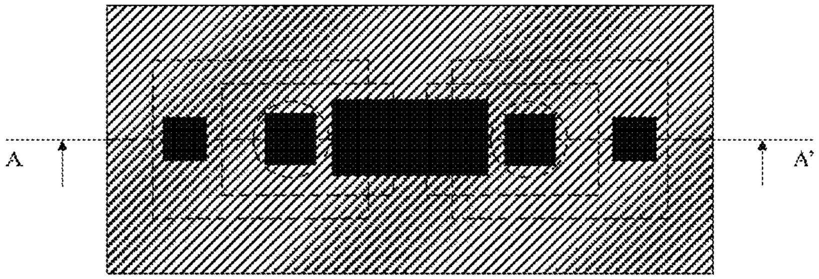
FIGS. 21*a* and 21*b* schematically show a step of filling contact holes with metal 0 and isolate conductive layers of the device by CMP according to one embodiment of the present disclosure, where (21*a*): a top view; and (21*b*): a sectional view along A-A' in (21*a*)
Figure 21B:
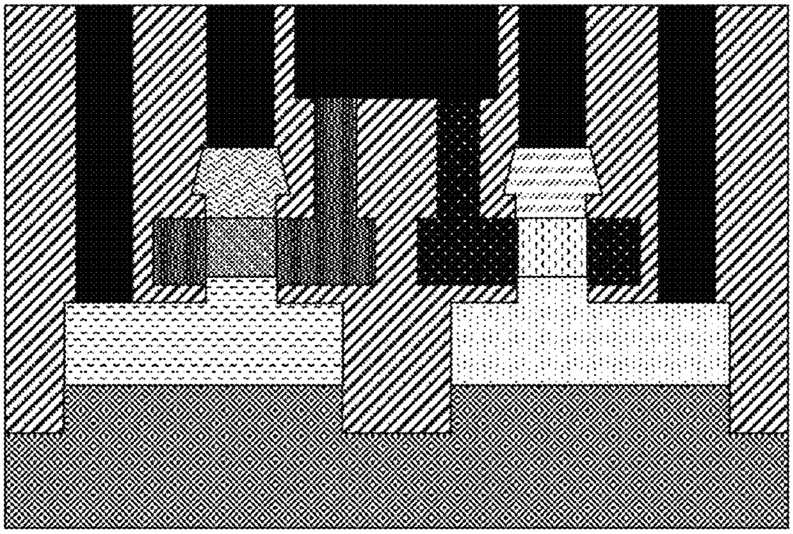
Figure 22:
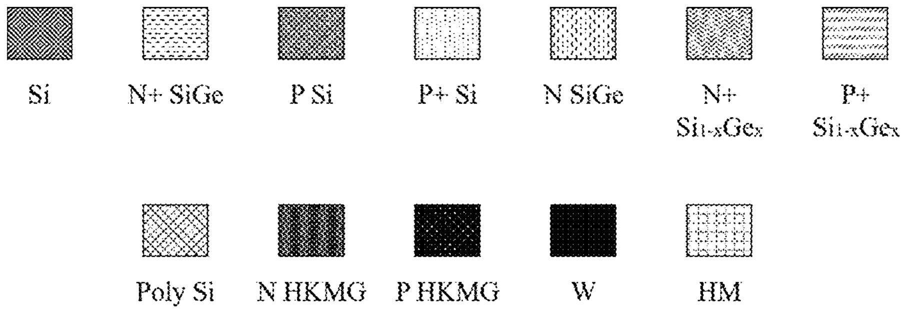
FIG. 22 schematically illustrates patterns shown in FIGS. 1*a*-21*b* according to one embodiment of the present disclosure.

24) By performing CMP on the metal 0, the conductive layers between the devices were separated to achieve the device isolation, as shown in FIGS. 21a and 21b.

25) Subsequently, the existing back-end-of-line (BEOL) process was performed to complete integration of the vertical channel nanowire transistor.

Described above are merely preferred embodiments of the disclosure, which are not intended to limit the disclosure. It should be understood that any modifications and replacements made by those skilled in the art without departing from the spirit of the disclosure should fall within the scope of the disclosure defined by the appended claims.

What is claimed is:

1. A method for fabricating a vertical channel nanowire transistor with asymmetric stress distribution, comprising:

(A) growing epitaxially a single crystal material layer on a substrate, wherein for a N-type metal oxide semiconductor (NMOS) device, a lattice constant of a heavily-doped active region material is greater than that of a first lightly-doped channel layer; and for a P-type metal oxide semiconductor (PMOS) device, a lattice constant of a heavily-doped active region material is less than that of a second lightly-doped channel layer; forming a laminate consisting of a bottom source-drain material and a channel material; and generating a vertical uniaxial stress in each of the first lightly-doped channel layer and the second lightly-doped channel layer through lattice mismatch;

(B) forming an inter-device isolation in an active layer;

(C) forming a vertical channel by patterning;

(D) depositing a layer of a first dielectric material to form a bottom gate isolation;

(E) depositing a layer of a dummy gate material followed by patterning to form a dummy gate pattern;

(F) depositing a layer of a second dielectric material to form a top gate isolation;

(G) patterning the top gate isolation, and forming a top source-drain by epitaxy growth, wherein for the NMOS device, a lattice constant of a material of the top source-drain is greater than that of the first lightly-doped channel layer; for the PMOS device, the lattice constant of the material of the top source-drain is less than that of the second lightly-doped channel layer; and the lattice constant of the material of the top source-drain is different from a lattice constant of the bottom source-drain material to realize asymmetric stress distribution in the vertical channel and regulation of channel stress, so as to ensure that the vertical uniaxial stress is generated on each of the first lightly-doped channel layer and the second lightly-doped channel layer through lattice mismatch;

(H) removing a dummy gate; and forming a gate oxide layer and a metal gate;

(I) forming a source metal contact, a drain metal contact and a gate metal contact; and (J) performing a back-end-of-line (BEOL) process to complete integration of the vertical channel nanowire transistor.

2. The method of claim 1, wherein the step (A) comprises:
(A1) covering a PMOS region with a first hard mask material, and selectively growing epitaxially a layer of a first semiconductor material on the substrate to form a N-type heavily-doped active region, wherein the N-type heavily-doped active region is a lower source or drain end of a vertical transistor;
(A2) growing epitaxially a layer of a second semiconductor material to form a P-type lightly-doped region, wherein a thickness of the P-type lightly-doped region defines a channel length of a N-type device;
(A3) removing the first hard mask material from the PMOS region; and covering a NMOS region with a second hard mask material;
(A4) selectively growing epitaxially a layer of a third semiconductor material to form a P-type heavily-doped active region, wherein the P-type heavily-doped active region is the lower source or drain end of the vertical transistor; and
(A5) growing epitaxially a layer of a fourth semiconductor material to form a N-type lightly-doped region, wherein a thickness of the N-type lightly-doped region defines a channel length of a P-type device;
wherein each of the first semiconductor material, the second semiconductor material, the third semiconductor material, and the fourth semiconductor material has a single crystal structure.

3. The method of claim 1, wherein the step (C) comprises:
(C1) depositing a layer of a third dielectric material as a hard mask material to protect a channel pattern from being etched;
(C2) defining the vertical channel by photolithography, wherein a size and shape of the vertical channel determine a channel section of the vertical channel nanowire transistor;
(C3) forming a hard mask pattern by anisotropic etching, wherein each of the first lightly-doped channel layer and the second lightly-doped channel layer is exposed in an area unprotected by a photoresist; and
(C4) forming the vertical channel by anisotropic etching, wherein a bottom heavily-doped active region is exposed in the area unprotected by the photoresist, and an etching depth is larger than a thickness of an entire lightly-doped area.

4. The method of claim 1, wherein the step (D) comprises:
(D1) depositing the layer of the first dielectric material;
(D2) planarizing a surface of the layer of the first dielectric material through chemical mechanical polishing (CMP); and
(D3) etching back the layer of the first dielectric material to a position below the channel layer by anisotropic etching, wherein a size of the layer of the first dielectric material below a lower surface of the channel layer is a size of a gate-to-source/drain overlap area.

5. The method of claim 1, wherein the step (E) comprises:
(E1) depositing the layer of the dummy gate material;
(E2) planarizing a surface of the layer of the dummy gate material through CMP;
(E3) etching back the layer of the dummy gate material to a position below a surface of a hard mask by anisotropic etching and above a surface of each of the first lightly-doped channel layer and the second lightly-doped channel layer, wherein a remaining thickness of the layer of the dummy gate material defines a gate length;
(E4) removing the hard mask;
(E5) forming the dummy gate pattern by photolithography, wherein the dummy gate pattern determines a gate layout of the vertical channel nanowire transistor; and
(E6) removing the dummy gate material that is not protected by photoresist by anisotropic etching to expose the bottom gate isolation.

6. The method of claim 1, wherein the step (F) comprises:
(F1) depositing the layer of the second dielectric material, wherein the second dielectric material is the same as the first dielectric material; and a thickness of the layer of the second dielectric material is greater than a height of the dummy gate pattern;
(F2) planarizing a surface of the layer of the second dielectric material through CMP; and
(F3) thinning the layer of the second dielectric material by anisotropic etching such that a thickness of the layer of the second dielectric material meets requirements of an isolation gate and source-drain.

7. The method of claim 1, wherein the step (G) comprises:
(G1) defining an epitaxial window of the top source-drain by photolithography, wherein a photolithographic pattern is aligned with a lower channel pattern;
(G2) forming the epitaxial window of the top source-drain by anisotropic etching to expose the first lightly-doped channel layer or the second lightly-doped channel layer; and
(G3) forming a top heavily-doped source-drain by selective epitaxial growth, wherein the material of the top source-drain has a single crystal structure;
and for the NMOS device, the lattice constant of the material of the top source-drain is greater than that of the first lightly-doped channel layer; for the PMOS device, the lattice constant of the material of the top source-drain is less than that of the second lightly-doped channel layer.

8. The method of claim 1, wherein the step (H) comprises:
(H1) depositing a layer of a third dielectric material, wherein a thickness of the layer of the third dielectric material is greater than an epitaxy height of the top source-drain;
(H2) defining a window by photolithography and anisotropic etching to expose the layer of the dummy gate;
(H3) removing the dummy gate through isotropic etching;
(H4) filling a cavity formed after removing the dummy gate with a gate oxide layer material and a metal gate material in turn through isotropic shape retention; and
(H5) removing a top of the layer of the third dielectric material by anisotropic etching.

9. The method of claim 1, wherein the step (I) comprises:
(I1) depositing a layer of a third dielectric material as an interlayer isolation, and planarizing the layer of the third dielectric material by CMP;
(I2) forming a source contact hole, a drain contact hole, and a gate contact hole by photolithography and anisotropic etching;
(I3) filling the source contact hole, the drain contact hole, and the gate contact hole with a metal material; and
(I4) performing CMP on the metal material to separate conductive layers of devices, so as to realize device isolation.

10. The method of claim 1, wherein the substrate is a bulk silicon substrate, a silicon-on-insulator (SOI) substrate, a bulk germanium substrate, or a germanium-on-insulator (GOI) substrate.

* * * * *